United States Patent [19]

Kinsbron et al.

[11] 4,432,132
[45] Feb. 21, 1984

[54] FORMATION OF SIDEWALL OXIDE LAYERS BY REACTIVE OXYGEN ION ETCHING TO DEFINE SUBMICRON FEATURES

[75] Inventors: Eliezer Kinsbron, Highland Park; William T. Lynch, Summit, both of N.J.

[73] Assignee: Bell Telephone Laboratories, Incorporated, Murray Hill, N.J.

[21] Appl. No.: 328,368

[22] Filed: Dec. 7, 1981

[51] Int. Cl.³ ............... H01L 21/42; H01L 21/423; C23C 15/00
[52] U.S. Cl. ................. 29/571; 29/576 B; 204/192 E; 156/643
[58] Field of Search ............ 29/571, 576 B; 204/192 E, 192 EC; 427/38, 43.1, 96; 156/643; 148/1.5

[56] References Cited

U.S. PATENT DOCUMENTS

| | | | |
|---|---|---|---|
| 3,920,483 | 11/1975 | Johnson | 156/643 |
| 4,037,307 | 7/1977 | Smith | 29/571 |
| 4,049,521 | 9/1977 | Convertini | 204/192 EC |
| 4,211,582 | 7/1980 | Horng | 204/192 E |
| 4,234,362 | 11/1980 | Riseman | 204/192 E |
| 4,287,660 | 9/1981 | Nicholas | 29/571 |
| 4,343,082 | 8/1982 | Lepselter | 29/576 B |
| 4,343,677 | 8/1982 | Kinsbron | 427/43.1 |
| 4,356,210 | 10/1982 | Imai | 204/192 EC |
| 4,356,623 | 11/1982 | Hunter | 29/571 |

FOREIGN PATENT DOCUMENTS 55-39647  3/1980  Japan ..................... 204/192 E

OTHER PUBLICATIONS

"Masking for Ion Beam Etching", Gloerson, P. G., *Solid State Technology*, Apr. 1976, pp. 68–73.
"Ion Etching for Pattern Delineation", Melliar-Smith, *J. Vac. Sci. Technol.*, vol. 13, No. 5, Sep./Oct., 1976, pp. 1008–1022.
"Microfabrication by Ion-Beam Etching", Lee, R. E., *J. Vac. Sci. Technol.*, 16(2), Mar./Apr. 1979, pp. 164–170.
W. R. Hunter, et al., *IEEE Electron Device Letters*, "A New Edge-Defined Approach for Submicrometer MOSFET Fabrication," vol. EDL-2, No. 1, Jan. 1981, pp. 4–6.

*Primary Examiner*—L. Dewayne Rutledge
*Assistant Examiner*—J. J. Zimmerman
*Attorney, Agent, or Firm*—David I. Caplan

[57] ABSTRACT

This invention involves the defining of a submicron feature (21 or 93) in a structure, typically an insulated gate field effect transistor structure (30, 40, or 110). This feature is defined by a sidewall oxide protective masking layer (21 or 71) formed by reactive oxygen ion etching of the structure being built at a time when an exposed surface thereof in the vicinity of the sidewall contains atoms of a material—for example, silicon or aluminum—which combine with the oxygen ions to form the sidewall oxide layer.

16 Claims, 13 Drawing Figures

FORMATION OF SIDEWALL OXIDE LAYERS BY REACTIVE OXYGEN ION ETCHING TO DEFINE SUBMICRON FEATURES

FIELD OF THE INVENTION

This invention relates to methods for fabricating semiconductor integrated circuits, and more particularly to methods for forming submicron features of semiconductor integrated circuit transistor devices.

BACKGROUND OF THE INVENTION

Short channel (below about 2 micron) insulated gate field effect transistors, also known as metal oxide semiconductor field effect transistors (MOSFETs), are desirable for high frequency operation, typically above 50 MHz. In the pending patent applications entitled "Method for Making Short Channel Transistor Devices," Ser. No. 141,121, filed by H. J. Levinstein on Apr. 17, 1980, and "Short Channel Field Effect Transistors," Ser. No. 141,120 filed by M. P. Lepselter et al. also on Apr. 17, 1980, now U.S. Pat. No. 4,343,082, methods are described for making insulated gate field effect transistors with extremely small (500 Å or less) separations between the extremities of the gate regions and those of the source (and drain) regions. The transistors were therefore characterized by desirably small source-to-channel resistances.

The methods taught in the aforementioned Levinstein and Lepselter et al. patent applications include the formation of thin silicon dioxide layers on the sidewalls of polycrystalline silicon gate electrodes by thermal growth. The resulting sidewall oxide layer is useful as a spacer layer for aligning the source relative to the gate region channel.

Although rather thin (as low as about 200 Å) layers of the required sidewall oxide can be formed by thermal growth of silicon dioxide on the polycrystalline silicon ("polysilicon") gate, an undesirable limitation of such thermal growth stems from the facts that: (1) oxide growth on the polysilicon is not easily controlled or uniform, owing to the polycrystalline structure of the underlying polysilicon; (2) at the same time that the sidewall oxide is being grown, the source-to-drain length of the polysilicon gate electrode correspondingly is diminished; so that control over the crucial length of the gate electrode, and hence of the underlying transistor channel, is deteriorated; (3) the oxides simultaneously grown over the source and drain regions force down the top surfaces of the source and drain to levels below the top surface of the channel region by undesirably large amounts (approximately equal to one-half the thickness of the grown oxide); and (4) a separate etching step is required for the removal of the grown oxide from locations overlying the source and drain.

Accordingly, it would be desirable to have a method for defining features in semiconductor transistor structures by forming sidewall oxide layers which mitigates one or more of these shortcomings of the prior art.

SUMMARY OF THE INVENTION

This invention is for a method of defining a submicron feature in a structure characterized by the step of reactive ion etching said structure with oxygen ions to form an oxide layer on a vertical sidewall of a horizontal layer located on a limited portion of a major surface of the structure. The oxide layer is formed by reaction of the oxygen ions with material that has been back-sputtered from the major surface during the reactive ion etching in the neighborhood of the sidewall. For example, the material thus to be back-sputtered from the major surface can contain silicon or aluminum atoms whereby the oxide layer is, respectively, a silicon dioxide or aluminum oxide layer.

In a specific embodiment of the invention for making an insulated gate field effect transistor (FIGS. 1-5), a thin (about 50 to 500 Å, i.e., 0.005 to 0.05 micron) sidewall oxide layer is formed on a vertical sidewall of a polycrystalline silicon (polysilicon) gate electrode of an insulated gate field effect transistor structure by reactive oxygen ion etching of exposed portions of a major surface of underlying silicon dioxide and silicon semiconductor layers. After the exposed silicon dioxide has been etched away and the underlying silicon has been exposed, a metal which can react with exposed silicon to form metal silicide is then deposited to form metal silicide electrodes for Schottky barrier source and drain of the transistor, each electrode having an extremely small separation (about 50 to 500 Å) from the gate region in the semiconductor underlying the polysilicon gate electrode. A metal silicide can be simultaneously formed on the then exposed surface of the polysilicon gate. As an alternative to the metal silicide electrodes, impurity zones can be formed as source and drain by ion implantation (FIG. 6).

In another specific embodiment of the invention (FIGS. 7-13), also for making an insulated gate field effect transistor, a thin (typically about 1000 to 1500 Å thick) oxide layer is formed on vertical sidewalls of a patterned resist layer located on a metal layer, by means of reactive oxygen ion etching of the exposed portions of the metal layer located between the sidewalls of the resist layer. Typically the metal layer is aluminum, so that the resulting oxide layer is aluminum oxide, typically in the range of about 1,000 to 1,500 Å thick. The aluminum layer is, in turn, located on a polycrystalline silicon layer. After removal of the resist layer, the remaining aluminum oxide layer can be used as an etch mask, typically 3,000 Å (0.3 micron) in lateral extent, for forming a polycrystalline silicon gate of the same lateral extent as that of the etch mask as defined by the thickness of the thin oxide layer.

BRIEF DESCRIPTION OF THE DRAWING

This invention may be better understood from the following detailed description when read in conjunction with the drawings in which.

Only for the sake of clarity, none of the drawings is to scale.

DETAILED DESCRIPTION

Figure 1:
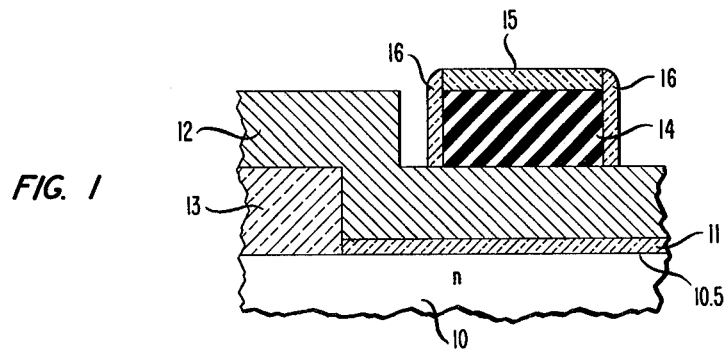
FIGS. 1-5 depict in cross section various stages of an insulated gate field effect transistor structure which is being fabricated in accordance with a specific embodiment of the invention.

Referring to FIG. 1, a silicon semiconductor body 10 (FIG. 1), typically of n-type conductivity, has a major planar horizontal surface 10.5, typically a (100) crystallographic plane; and the body has a uniform net significant donor impurity concentration in the neighborhood of the surface equal to typically about $1 \times 10^{16}$ impurities per cm$^3$. A relatively thin gate oxide layer 11 of thermally grown silicon dioxide and a relatively thick field oxide layer 13 are located on complementary portions of the surface 10.5 in a conventional pattern for forming a multiplicity of similar transistor device structures on the major surface 10.5. A polycrystalline silicon ("polysilicon") layer 12 is located on the exposed top surfaces of the gate oxide layer 11 and the field oxide layer 13. On top of a limited portion of the polysilicon layer 12 is located a resist layer 14, typically Hunt's resist HPR-204, and an auxiliary silicon dioxide layer 15.

Both layers 14 and 15 (FIG. 1) can have been previously patterned in accordance with, for example, the tri-level process described by J. M. Moran and D. Maydan in an article entitled "High Resolution, Steep Profile, Resist Patterns" published in *Bell System Technical Journal*, Vol. 58, pp. 1027–1036 (1979). As a result of this tri-level process, which utilizes reactive oxygen ion etching to pattern the resist layer 14, sidewall build-up layers 16 of silicon dioxide form on the vertical sidewalls of the patterned resist layer 14 during the last phase of this reactive oxygen ion etching (when portions of the polysilicon layer 12 become exposed and, after being physically back-sputtered, react with the oxygen ions). The width of the layers 14 and 15 as thus patterned is typically about 1 or 2 micron. Formation of such sidewall oxide build-up layers was previously disclosed in patent application Ser. No. 246,690 filed in the United States on Mar. 23, 1981 by E. Kinsbron et al. entitled "Improved Method for Patterning Films Using Reactive Ion Etching Thereof," in which the build-up layers were considered to be undesirable.

The oxide build-up layer 16 together with the patterned oxide layer 15 are preferably then both completely removed by a room-temperature treatment with a solution of buffered hydrofluoric acid (NH$_4$F and HF in typically a 30:1 molar ratio). Next, using the patterned resist layer 14 as a protective mask, the structure of FIG. 1 is placed in a suitable chamber and subjected to anisotropic etching with chlorine gas, at a pressure of typically about 10 micron Hg, with an RF power density of typically about 0.1 watt/cm$^2$, and an RF frequency of about 13.56 MHz. By "anisotropic" etching is meant that substantially vertical sidewalls are formed in the etched material at locations underlying edges of any protective mask used during the etching, that is, at intersections of regions of etched and non-etched material. Thereby the polysilicon layer 12 is patterned (FIG. 2) to serve as a polysilicon gate electrode layer of predetermined width, typically about 1 to 2 micron, with substantially vertical sidewalls 12.5 due to the anisotropy of the chlorine etching.

Figure 2:
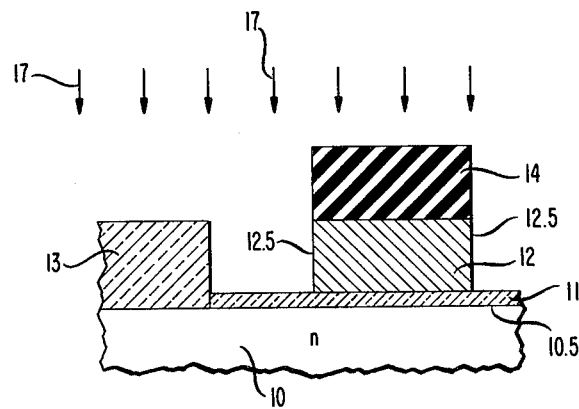
Figure 3:
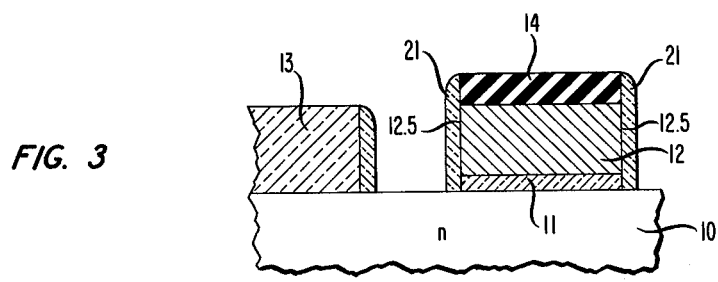

The top surface of the resulting structure shown in FIG. 2 is then subjected (advantageously in the same chamber used for the previous chlorine ion etching step) to a vertical bombardment of oxygen ions 17 suitable for anisotropically reactively ion etching the gate oxide layer 11, thereby a sidewall silicon dioxide layer 21 (FIG. 3) is formed on the vertical sidewalls 12.5 of the gate electrode layer 12 (as well as on resulting sidewalls of the gate oxide layer 11). Preferably, in order to ensure complete removal of the exposed portions of the silicon dioxide layer 11 at regions overlying future source and drain zones, the reactive ion etching is carried out for a sufficient time that about 15 Å of silicon from the body 10 is removed at the exposed portions of the surface 10.5 underlying the areas between the field oxide and the gate electrode. During this reactive ion etching of the gate oxide, a top portion of the resist layer 14 is simultaneously also removed.

By using the same chamber for the oxygen ion etching as previously used for the chlorine ion etching, residues of chlorine are automatically removed from the chamber during the oxygen ion etching.

The oxygen reactive ion etching of the exposed portion of the silicon dioxide layer 11 is performed, for example, in a chamber containing pure oxygen (partially ionized) or a gas mixture (partially ionized) of oxygen and about 0.5 percent to 1.0 percent by volume carbon tetrafluoride (CF$_4$). For anisotropy of the etching, a relatively low oxygen pressure is used, ordinarily in the useful range of about 2 to 4 micron Hg, with a relatively higher RF power density, ordinarily in the useful range of about 0.25 to 0.75 watt/cm$^2$ with an RF frequency of typically about 13.56 MHz.

During this reactive oxygen ion etching of the oxide layer 11, it is believed that the oxygen ions react with the silicon which is back-sputtered from the exposed portion of this silicon dioxide layer 11 (and subsequently from the exposed portion of the silicon body 10) to form a plasma from which the sidewall silicon dioxide layer 21 (FIG. 3) is deposited on the sidewall 12.5 of the gate electrode layer 12. On the other hand, it may be that a transport of silicon and oxygen from the silicon dioxide layer 11 to form the sidewall oxide layer 21 can be performed by a bombardment with ions other than oxygen.

In cases of only partially etching the portion of the oxide layer 11 overlying the body 10 between the polysilicon gate layer 12 and the field oxide layer 13, the sidewall oxide layer 21 can be of thickness (measured at the bottom) as low as about 50 Å, and in any event is ordinarily in the range of about 50 Å to 500 Å. On the other hand, in cases of over-etching this oxide layer 11 and etching into underlying silicon of the body 10, the thickness of the sidewall oxide layer 21 is typically in the range of about 500 to 2,000 Å.

The thickness of the sidewall oxide layer 21 increases as the reactive ion etching time increases and the etching process progresses below the original surface 10.5 of the silicon body 10. The sidewall oxide thickness can thus be controlled by controlling the thickness of the gate oxide layer 11 (plus the thickness of silicon removed by the reactive oxygen ion etching) and the time duration of exposure to the reactive ion etching. The sidewall oxide layer 21 serves as a spacer to control the distance (of closest approach) of the source and drain (to be formed) from the gate region of the field effect transistor being built.

After this reactive oxygen ion etching step has been performed, any remaining exposed portion of the oxide layer 11 is completely removed, as by plasma etching with Freon 23 (a mixture of about 96 percent by volume CHF$_3$ with NH$_3$). Advantageously, in ordr to avoid undesirable isotropic etching which would be caused by any mixing of residual CHF$_3$ with Cl$_2$ in a future repetition of the process being described, this plasma etching with Freon is performed in a different chamber from that just previously used for the reactive oxygen ion etching. Any remaining thickness of the organic resist layer 14 is thereafter removed by a standard method, such as treatment with a mixture (about 5:1 by volume) of sulphuric acid and hydrogen peroxide at a temperature typically of about 85° C.

Figure 4:
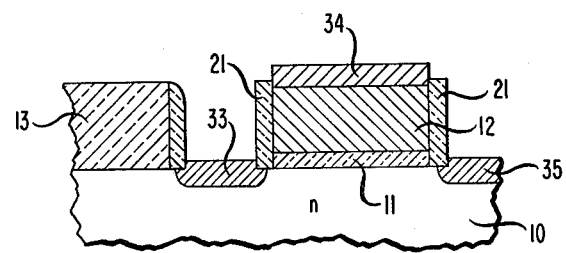

Referring next to FIG. 4, platinum silicide is formed on the exposed surface of the silicon body 10 and on the gate electrode 12, to form source and drain Schottky barrier platinum silicide electrode contacts 33 and 35 plus a gate electrode platinum silicide metallization layer 34. The portion of the body 10 directly underlying the gate electrode 12 constitutes the channel region of the first transistor structure. In ordr to form the platinum silicide, platinum is deposited, as by evaporation, to a thickness of about 150 Å all over the structure being built, typically at a (room) temperature of about 25° C., and is then sintered, typically by heating in argon and 1 or 2% by volume oxygen for about 30 minutes at about 625° C., to form platinum silicide wherever silicon underlies the deposited platinum. Alternatively, sputtering of the platinum onto the heated structure (typically about 600° C. to 650° C.) can be used to form the platinum silicide directly. The remaining platinum (overlying oxide) is then removed, typically by etching with aqua regia.

Figure 5:
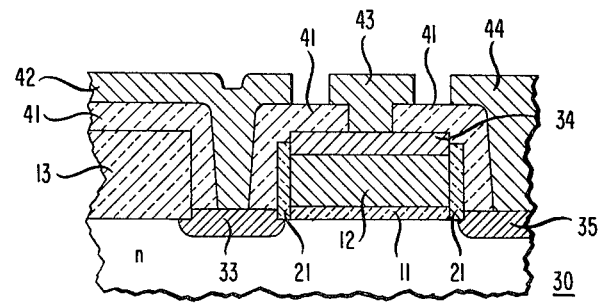

Thereafter, a patterned insulating layer 41 is formed on the structure 30 being built (FIG. 5). This insulating layer 41 is typically silicon dioxide (formed typically from a mixture of silane and oxygen) or TEOS (tetra-ethyl-ortho-silicate, deposited at a temperature less than about 500° C.) having a thickness of typically about 10,000 Å, and is formed and patterned by conventional chemical vapor deposition followed by selective masking and etching through windows. Finally, a patterned metallization layer 42, 43, and 44, such as aluminum, is applied—typically by evaporation followed by selective masking and etching—for making metallization contacts to the platinum silicide electrodes 33, 34, and 35. Thereby, an insulated gate field effect transistor structure 30 (FIG. 5) is formed. Advantageously, to preserve the Schottky barriers, at no time subsequent to the platinum sintering step is the structure being built heated above a temperature of about 500° C. An intermediate layer of material—such as doped polysilicon—can also be included between the aluminum metallization and the platinum silicide.

Thus, in accordance with the invention, the sidewall layer 21 serves as a protective mask and spacer to control the closest approach of the transistor source (and drain) region with respect to the transistor channel.

Prior to the deposition of the platinum to form the platinum silicide electrodes, as an option, significant acceptor impurities can be introduced into the silicon body 10 at its then exposed surface, thereby to form source and drain zones in the body; so that, instead of having the platinum silicide form Schottky barrier electrodes, the platinum silicide forms ohmic type electrode contacts to the source and drain zones. Moreover, when using metal silicides—such as cobalt silicide—that can withstand the high temperatures (about 900 degrees C.) required for activation of impurities, impurities can be alternatively implanted through such metal silicide electrodes 33 and 35 or can be introduced by deposition simultaneously with the metal deposition and then diffused by suitable annealing.

Instead of forming platinum silicide electrodes 33, 34, and 35 (FIG. 5), self-aligned impurity zones 57 and 58 for source and drain can be formed (FIG. 6), as by impurity ion implantation. During the ion implantation, the polycrystalline silicon gate electrode 12, together with the sidewall oxide layer 21, is used as a self-aligned mask, which provides an offset for the implanted regions in the silicon body 10 from the gate electrode 12. In such a case, moreover, a p-type conductivity silicon body 50 (FIG. 6) can be used in conjunction with n+ (strongly n-type) conductivity in zones 57 and 58, for making an N-channel transistor. Also, in such a case the reactive oxygen ion etching of the silicon dioxide layer 11 can be terminated some time prior to etch-through to the surface 50.5 of the silicon body 50, and ion implantation can then be performed through the remaining exposed thickness of this oxide layer 11 located between the polysilicon layer 12 and the field oxide layer 13, whereby shallower PN junctions of the n-type zones 57 and 58 are formed with the p-type region of the body 10. A patterned TEOS layer 51, source metallization 52, gate metallization 53, and drain metallization 54 complete a transistor device structure 40. The impurities for zones 57 and 58 for the transistor structure 40 can be introduced before or after removal of the original gate oxide layer still remaining in regions overlying the portion of the surface 10.5 located between the polysilicon layer 12 and the field oxide layer 13. The metallizations 52, 53, and 54 are typically formed by first depositing doped polycrystalline silicon and then depositing aluminum.

Figure 6:
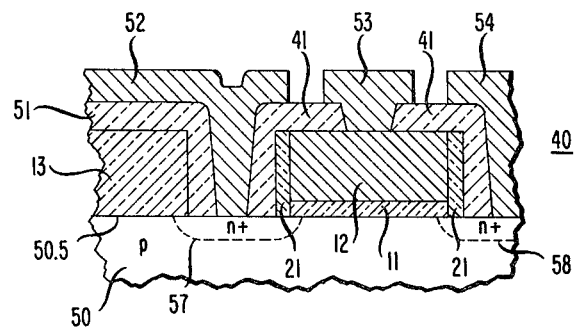
FIG. 6 depicts in cross section an insulated gate field effect transistor fabricated in accordance with another specific embodiment of the invention.

In the embodiment 40 shown in FIG. 6, the thickness of the sidewall oxide layer 21 is advantageously at least 200 Å, preferably about 500 Å, in order that after activation of the impurities by annealing (and consequent diffusion of the source and drain zones 57 and 58), the respective overlying edges of the gate electrode 12 can be located in substantial registry with the respective edges of these source and drain zones, in order to minimize overlap parasitic capacitance. Typically, activation of the impurities is performed by annealing at about 900° C. for about 30 minutes. Again, in accordance with the invention, this spacing can be rather precisely controlled even though the dimensions are of submicron size.

It should be understood that although the gate metallizations 43 and 53 are (symbolically) shown with a contact hole located directly over the gate oxide layer 11, ordinarily the contact hole is located over thick field oxide, that is, removed from the gate region in a direction perpendicular to the plane of the drawing.

By way of typical example for illustration purposes only, the gate oxide layer 11 is about 250 Å thick, the polycrystalline silicon layer 12 is about 3500 Å thick, the organic layer 14 is typically Hunt's photoresist about 1.8 micron thick, and the silicon dioxide layer 15 is about 1200 Å thick.

Ordinarily, high-temperature baking of the organic resist layer 14 (200° to 300° C. for about 30 to 180 minutes) is advisable to harden the resist so that it is resistant to further processing, such as plasma etching for defining the polysilicon gate electrode layer 12.

In another specific embodiment, a structure 70 (FIG. 7) includes a p-type silicon semiconductor body 60 which has a major planar horizontal surface 60.5, typically oriented parallel to the plane (100), upon which has been grown a gate oxide layer 61 and a field oxide layer 62. Upon this gate oxide layer 61 is located a polycrystalline silicon layer 63. On top of this polycrystalline silicon layer 63 is located an aluminum layer 64, typically deposited by evaporation to a thickness of about one micron. And on top of the aluminum layer 64 is located an organic resist layer 65. Further, on top of the resist layer 65 is a patterned silicon dioxide layer 66 and a patterned photoresist layer 67 to complete the structure 70 shown in FIG. 7. The structure 70 is thus similar to that shown in FIG. 1 at an earlier stage of the latter's processing, except for the addition of the aluminum layer 64. The patterned silicon dioxide layer 66 can have been patterned, for example, by either plasma etching or reactive ion etching with $CHF_3$ gas or Freon 23.

Figure 7:
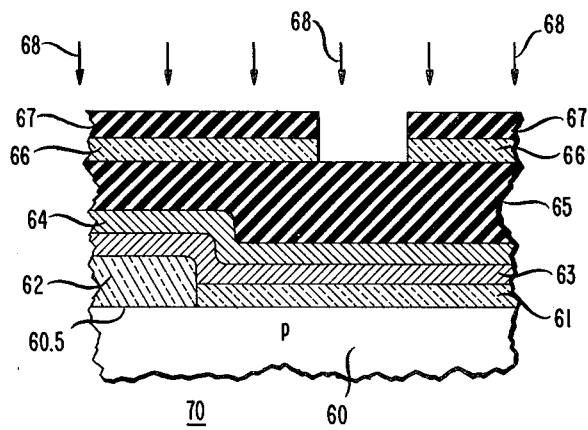
FIGS. 7-12 depict in cross section various stages of an insulated gate field effect transistor structure which is being fabricated in accordance with another specific embodiment of the invention.

The top surface of the structure 70 is then subjected to a reactive ion anisotropic etching with oxygen ions 68 (FIG. 7). This etching with oxygen can be done in the same chamber previously used to etch the oxide layer 66. For this purpose, for example, pure oxygen (partly ionized) or a gas mixture (partly ionized) of oxygen and about 0.5 to 1.0% by volume carbon tetrafluoride ($CF_4$) is used at a relatively low pressure in a useful range of about 2 to 4 micron Hg, typically about 3.5 micron Hg, in conjunction with an RF power in a useful range of about 0.25 to 0.75 watt/cm$^2$, typically about 0.5 watt/cm$^2$, at a typical frequency of about 13.56 MHz.

Figure 8:
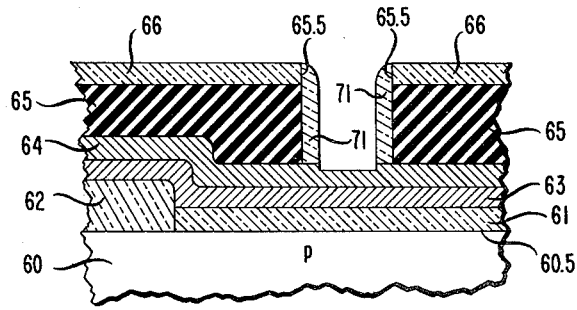

As a result of the continuation of the reactive ion etching after etching through the resist, aluminum oxide build-up layers 71 form on resulting vertical sidewalls 65.5 (FIG. 8) of the aperture thereby formed in the resist layer 65. Formation of such build-up layers of aluminum oxide was disclosed in the aforementioned patent application Ser. No. 246,690 filed in the United States on Mar. 23, 1981, by E. Kinsbron et al. entitled "Improved Method for Patterning Films Using Reactive Ion Etching Thereof," in which the aluminum oxide build-ups were considered to be undesirable. The thickness of the build-up layers 71 (measured at the bottom thereof) is proportional to the thickness of aluminum removed by this etching from the aluminum layer 64 as determined by the time duration of the reactive ion etching. Typically about 200 Å of aluminum is removed at the bottom of the resulting aperture in the resist layer 65 by over-etching with the oxygen ions 68. Next the structure being fabricated (FIG. 8) is subjected to a reactive ion etching, as with Freon 23 (mixture of 96 percent by volume $CHF_3$ and $NH_3$), in order to remove the patterned silicon dioxide layer 66 completely.

Figure 9:
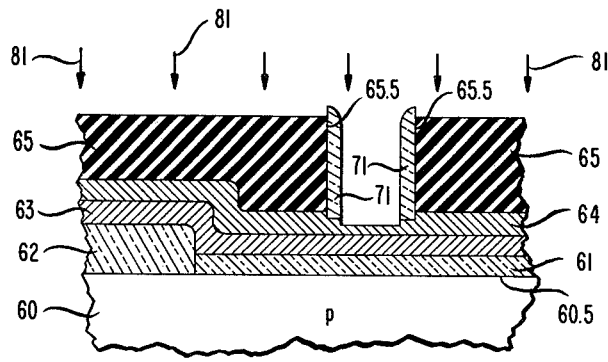

Next, etching with oxygen ions 81 (FIG. 9) is resumed and continued until the organic layer 81 is completely removed. Thereby the aluminum layer 64 is exposed in the areas between neighboring aluminum oxide build-up layers 71, and typically is over-etched by about 500 Å (in addition to the previous 200 Å over-etch by the earlier low pressure reactive ion etching by the oxygen ions 68). This etching of the organic layer and the previously exposed aluminum with oxygen will also increase the thickness of the build-up layers 71, typically by a factor of about 3 or 4.

Figure 10:
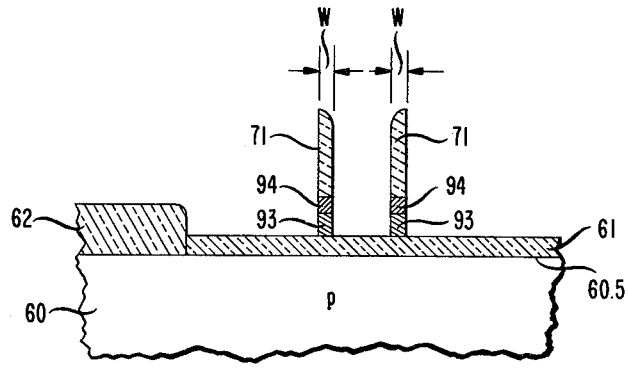

Next, using these build-up layers 71 as a protective mask against etching, anisotropic ion etching of the exposed portion of the aluminum layer 64, followed by anisotropic etching of the polycrystalline layer 63, brings the structure being fabricated into the condition illustrated in FIG. 10, wherein the aluminum layer 64 has become a patterned aluminum layer 94 and the polycrystalline silicon layer 63 has become a patterned polycrystalline silicon layer 93, both these patterned polycrystalline silicon layers having a width w determined by the thickness of the build-up layers 71.

For example, the anisotropic ion etching of the aluminum layer 64 to form the patterned layer 94 can be performed by using a mixture of about 75% by volume boron trichloride ($BCl_3$) and 25% chlorine ($Cl_2$) at a pressure of typically about 20 micron Hg, with an RF power density of typically about 0.1 watt/cm$^2$ at a frequency of about 13.56 MHz; and the anisotropic etching of the polycrystalline silicon layer 63 to form the patterned layer 93 can be performed by using a similar mixture of $BCl_3$ and $Cl_2$ at a pressure of typically about 10 micron Hg, in RF power density of typically about 0.06 watt/cm$^2$ at the frequency of about 13.56 MHz. The common width w of the patterned layers 93 and 94 is typically in the range of about 1500 to 4000 Å.

Figure 11:
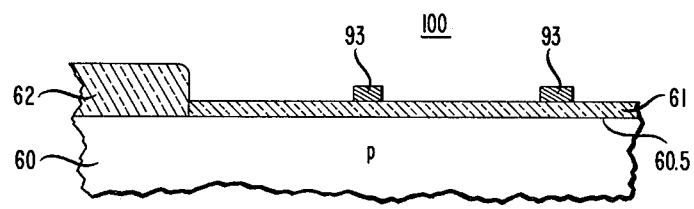
Figure 12:
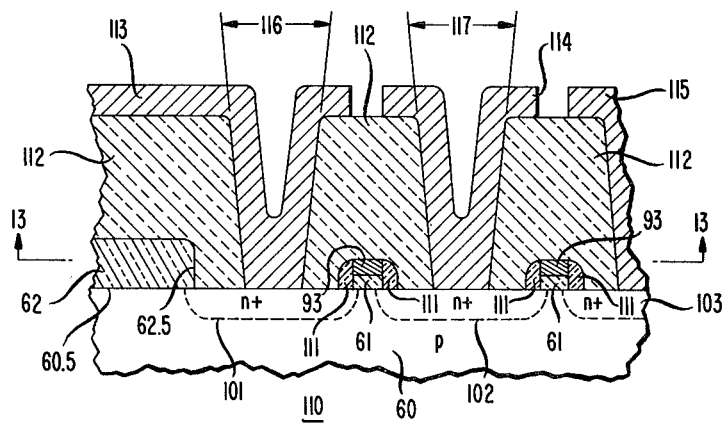
Figure 13:
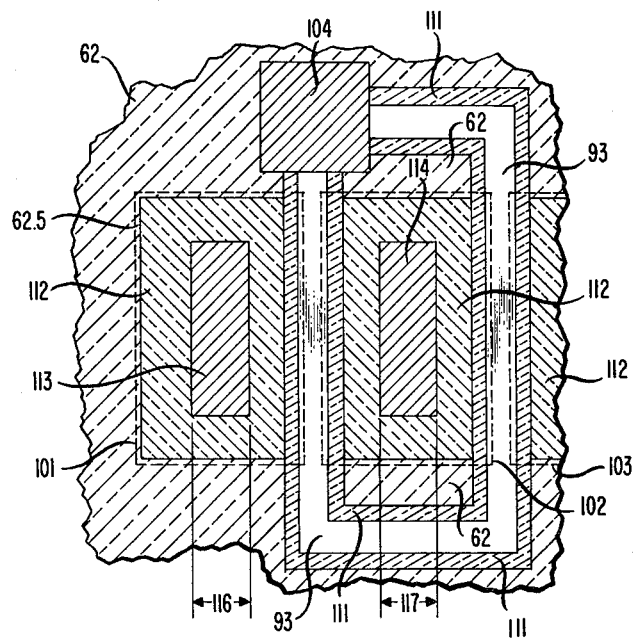
FIG. 13 depicts a top section view of the transistor structure shown in FIG. 12.

The patterned aluminum layer 94 is then etched isotropically to remove it completely and thus to remove also the overlying build-up layers 71. Typically solution etching can be used for this purpose, for example, with an aqueous solution of 16 parts by volume of 85 percent strength phosphoric acid, one part of 70 percent strength nitric acid, one part acetic acid, at about 45° C. for about two minutes. Thereby the aluminum layer 94 together with the aluminum oxide build-ups 71 are detached and removed from the structure being built (FIG. 11). Advantageously, another reactive ion etching step with oxygen is carried out to form sidewall build-up layers 111 of silicon dioxide on the vertical sidewalls of the remaining portions of the polysilicon layer 93. Ion implantation and activation thereof by annealing to form zones 101, 102, 103 is then carried out to define source, drain, and auxiliary source regions—all having cross sections as indicated in FIG. 12 and top view contours as indicated in FIG. 13. The auxiliary source region 103 is optional. The sidewall layers 111 thus serve as spacer layers for controlling the location of the closest approach of the source and drain regions to the gate region underlying the gate electrode 93. In addition, a gate metallization pad 104 can be added for external gate electrode access to a transistor structure 110 (FIGS. 12 and 13).

As further indicated in FIG. 12, the transistor 110 is metallized by first depositing an insulating layer, such as TEOS (tetra-ethyl-orthosilicate), patterning it to form a patterned insulating layer 112, and applying a metallization layer which is patterned to form a source electrode 113, a drain electrode 114, and another (auxiliary) source electrode 115 (if desired). The source electrode 113 contacts the source zone 101 through an aperture 116 in the patterned insulating layer 112, and the drain electrode 114 contacts the drain zone 102 through a separate aperture 117. The metallization for these electrodes 113, 114, and 115 is typically n-doped polysilicon overlaid with aluminum.

Although the invention has been described in detail in terms of specific embodiments, various modifications can be made without departing from the scope of the invention. For example, instead of aluminum the layer 64 can be a material such as tantalum or silicon dioxide—in conjunction with suitable anisotropic etching thereof with $CCl_3F$ or $CHF_3$, respectively—to form the patterned layer 94. The organic resist layer can also be polyimide designated PIQ, made by Hitachi-Ltd., Tokyo, Japan, or a polyimide designated Pyralin made by E. I. DuPont DeNemours and Co., Wilmington, Del., or a class of novalac-type resists designed HPR amide by Philip A. Hunt Chemical Corp., Palisades Park, N.J., or such standard products as KPR, KMER, AZ 1350, and Polychrome resists. Moreover, the buffered hydrofluoric acid treatment (to remove the oxide build-up layer 16 together with the patterned oxide layer 15 prior to patterning the polysilicon layer 12) can be omitted so that the oxide build-up layer 16 (as well as the patterned oxide layer 15) in FIG. 1 remains in place during subsequent etching for patterning of the polysilicon layer 12 and is thereafter removed by solution etching—a particularly useful alternative in cases where such subsequent etching of the polysilicon layer is not to be anisotropic.

What is claimed is:

1. A method for fabricating a semiconductor structure comprising the steps of forming, overlying a horizontal surface in a structure, a patterned layer having a vertical sidewall at the bottom of which is located an exposed surface of a first layer of first material, said first material containing atoms of a first kind, and forming on the vertical sidewall a masking layer of predetermined submicron horizontal thickness dimension, and using the masking layer to define a feature of the structure underlying the masking layer, the masking layer being formed by bombarding said horizontal surface portion with oxygen for a predetermined time to react with atoms of said first material, located at the exposed surface of the first layer, whereby the masking layer, comprising a chemical compound of oxygen and said atoms, is deposited on the vertical sidewall to the predetermined submicron thickness, and whereby the thickness of the first layer is reduced.

2. The method of claim 1 the first material is essentially a metal.

3. The method of claim 2 in which said metal is essentially aluminum.

4. The method of claim 1 said first material is essentially silicon dioxide.

5. A method for forming a submicron feature by forming a sidewall oxide layer on a vertical sidewall of a first layer of first material located on a limited portion of a second layer of second material, different from the first, said second layer located over a horizontal major surface of a semiconductor body, comprising a first step of reactive ion etching said second layer to form by back-sputtering of said second material a sidewall oxide layer on the vertical sidewall of the first layer whereby the thickness of the second layer is reduced by said reactive ion etching, and a second step of using said sidewall oxide layer as a protective mask for defining said feature.

6. The method of claim 5 in which the reactive ion etching is performed by bombardment with oxygen, said first layer is essentially a polycrystalline silicon layer, said body is essentially silicon, and said second layer is essentially silicon dioxide.

7. The method of claim 5 in which the reactive ion etching is performed by bombardment with oxygen, the body is essentially silicon, the first layer is essentially organic resist, and said second layer is essentially a layer of metal.

8. The method of claim 7 in which said second layer is separated from said major surface of the body by a layer comprising a polycrystalline silicon layer.

9. The method of claim 8 in which said polycrystalline silicon layer is separated from said major surface of the body by a silicon dioxide layer.

10. The method of claim 9 in which the layer of metal is essentially aluminum.

11. The method of claim 7 in which the layer of metal is essentially aluminum.

12. The method of claim 9, 10, or 11 further comprising a subsequent step of removing said first layer whereby at least a portion of said sidewall oxide layer remains overlying said major surface of the body.

13. The method of claim 12 in which the second step comprises selectively anisotropically etching said metal layer and said polycrystalline layer using the sidewall oxide layer as a protective mask, followed by the step of etching to remove completely said metal layer whereby said sidewall oxide layer is also removed and portions of said polycrystalline silicon layer remain only at those regions thereof essentially underlying said sidewall oxide layer prior to removal thereof, and whereby the width of said portions of said polycrystalline layer is of the submicron feature size as determined by the thickness of the sidewall oxide layer.

14. The method of claim 13 in which said protective mask prevents a chemical reaction of the polycrystalline silicon of the gate electrode at said sidewall thereof with a metal which is deposited on said protective layer and on a neighborhood thereof to form a silicide of said metal at said exposed portion of the major surface of the body.

15. A method for fabricating an insulated gate field effect transistor in which a gate oxide layer is grown on a major horizontal surface of a silicon body and a polycrystalline silicon gate electrode having a vertical sidewall is formed on a limited portion of the surface of the gate oxide layer comprising the step of forming an insulating layer of predetermined thickness on said sidewall by subjecting an exposed portion of the gate oxide layer, complementary to said limited portion, to reactive ion etching with oxygen to expose the major surface of the body underlying said complementary portion, and whereby the thickness of the exposed portion of the gate oxide layer is reduced.

16. The method of claim 15, or 14 further comprising the step of implanting impurity ions into the exposed portion of the surface of the body to form implanted regions therein, whereby said insulating layer on said sidewall acts as a protective mask against said implanting in order to provide an offset for the implanted regions.

* * * * *

UNITED STATES PATENT AND TRADEMARK OFFICE
CERTIFICATE OF CORRECTION

PATENT NO. : 4,432,132

DATED : February 21, 1984

INVENTOR(S) : Eliezer Kinsbron and William T. Lynch

It is certified that error appears in the above-identified patent and that said Letters Patent is hereby corrected as shown below:

Column 5, line 15, "ordr" should read --order--. Column 9, line 35, "claim 1 the first" should read --claim 1 in which the first--; line 39, "claim 1 said first" should read --claim 1 in which said first--.

Signed and Sealed this

Fifteenth Day of May 1984

[SEAL]

Attest:

Attesting Officer

GERALD J. MOSSINGHOFF

Commissioner of Patents and Trademarks